(12) United States Patent
Goodson et al.

(10) Patent No.: US 8,755,447 B2
(45) Date of Patent: Jun. 17, 2014

(54) WIRELESS AUDIO EQUIPMENT USING A QUADRATURE MODULATION SYSTEM

(75) Inventors: Michael Joseph Goodson, Bloomingdale, IL (US); Thomas J. Kundmann, Cary, IL (US); Jeffrey Arthur Meunier, Deerfield, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 653 days.

(21) Appl. No.: 12/975,730

(22) Filed: Dec. 22, 2010

(65) Prior Publication Data

US 2012/0163627 A1      Jun. 28, 2012

(51) Int. Cl.
*H04B 14/06*      (2006.01)

(52) U.S. Cl.
USPC ........... 375/247; 375/150; 375/259; 375/269; 375/298

(58) Field of Classification Search
USPC ......... 375/247, 285, 150, 259, 269, 298, 302, 375/316, 320; 341/131, 143, 144
See application file for complete search history.

(56) References Cited

U.S. PATENT DOCUMENTS

| | | | | |
|---|---|---|---|---|
| 5,530,722 | A * | 6/1996 | Dent | 375/298 |
| 6,317,468 | B1 * | 11/2001 | Meyer | 375/269 |
| 6,744,825 | B1 * | 6/2004 | Rimstad et al. | 375/298 |
| 7,369,077 | B2 * | 5/2008 | Carroll | 341/153 |
| 7,696,914 | B2 * | 4/2010 | Pai et al. | 341/143 |
| 8,165,549 | B2 * | 4/2012 | Pozsgay et al. | 455/243.1 |
| 2004/0223553 | A1 * | 11/2004 | Kumar | 375/259 |
| 2007/0160164 | A1 | 7/2007 | Sahota | |
| 2009/0252206 | A1 | 10/2009 | Rheinfelder | |
| 2010/0219888 | A1 * | 9/2010 | Lesso | 330/136 |

FOREIGN PATENT DOCUMENTS

WO      2004/030221 A1      4/2004

OTHER PUBLICATIONS

Jarman, David. "A Brief Introduction to Sigma Delta Conversion," Application Note AN9504, May 1995, pp. 1-7, Intersil Corporation.
International Search Report from related PCT Application PCT/US2011/065051 mailed on Apr. 11, 2012.

* cited by examiner

*Primary Examiner* — Dhaval Patel
(74) *Attorney, Agent, or Firm* — Banner & Witcoff, Ltd.

(57) ABSTRACT

A communications system, e.g., a wireless microphone, incorporates a quadrature modulator system to reduce power consumption with respect to traditional approaches and is general in nature to support any two-dimensional digital technique. The quadrature modulator system comprises different subsystems, including a digital-analog transformation circuit, a baseband filter, and a quadrature modulator. The digital-analog transformation circuit converts discrete time samples to a continuous time signal, and further includes an oversampling noise-shaping modulator such as a sigma-delta modulator. The baseband filter then removes out-of-band energy including sampling images and quantization noise. Some of the circuit components may comprise discrete devices that may result in a reduction of power consumption for the quadrature modulator system. Alternatively, some or all of the circuit components may be incorporated in a single electronic device. For example, an in-phase/quadrature-phase (I/Q) converter and oversampling noise-shaping modulator may be implemented within one field-programmable gate array.

9 Claims, 9 Drawing Sheets

WIRELESS AUDIO EQUIPMENT USING A QUADRATURE MODULATION SYSTEM

TECHNICAL FIELD

Aspects of the disclosure include processing of an input signal over a wireless communication channel to receiving and signal processing equipment using digital modulation techniques. In particular, aspects of the invention relate to wireless audio equipment (e.g., wireless microphones).

BACKGROUND

A wireless microphone (which may be referred as a radio microphone) is typically a microphone without a physical cable connecting the wireless microphone directly to associated sound recording or amplifying equipment. There are numerous standards spanning different transmission spectra and transmission technologies used to support a wireless microphone's connection to associated receiving equipment. For example, the connection may utilize ultra-high frequencies (UHF) or very high frequency (VHF) frequencies with an analog modulation technique such as frequency modulation (FM) or amplitude modulation (AM). Some low cost wireless models may use infrared light typically requiring a direct line of sight between the wireless microphone and the receiving apparatus, while costlier radio frequency models may use radio frequency signal that does not require a direct line of sight. Some models operate on a single fixed frequency, but the more advanced models often operate on a user selectable frequency to avoid interference allow the use of several wireless microphones at the same time.

Wireless microphones are often advantageous by providing greater freedom of movement for the artist or speaker, avoidance of cabling problems common with wired microphones, and reduction of cable "trip hazards" in the performance space. However, wireless microphones may have deficiencies resulting from limited range, excessive range causing interference to/from other radio equipment, and limited operating time. Operating time is limited relative to battery life and is typically shorter than a normal condenser microphone due to greater drain on batteries from transmitting circuitry from circuitry providing extra features.

Wireless microphone technology is currently moving from analog approaches such a FM to digital approaches. However, digital approaches often involve complex modulation (i.e., simultaneous amplitude and phase modulation of the transmitted carrier waveform). Such complex modulation often complicates the modulator as compared to analog approaches. For example, traditional FM systems are often highly optimized in terms of battery life (i.e., power consumption) and monetary cost.

SUMMARY

This summary is provided to introduce a selection of concepts in a simplified form that are further described below in the Detailed Description. However, this summary is not intended to identify key features or essential features of the disclosure.

A communications system incorporates a quadrature modulator system to reduce power consumption with respect to traditional approaches and may support any two-dimensional digital technique. The quadrature modulator system comprises different subsystems, including a digital-analog transformation circuit, a baseband filter, and a quadrature modulator. The digital-analog transformation circuit converts discrete time samples to a continuous time signal, and further includes an oversampling noise-shaping modulator such as a sigma-delta modulator. The baseband filter then removes out-of-band energy including sampling images and quantization noise. Embodiments may support different types of wireless audio equipment including wireless microphones and audio body packs.

With another aspect of the disclosure, an oversampling noise-shaping modulator converts a digital in-phase (I) signal and a digital quadrature (Q) signal to a quantized I signal and the digital Q signal to a quantized Q signal, respectively, where the quantized signals are quantized with a desired number of quantized bits per sample. A digital-analog converter (DAC) then converts the quantize signals into corresponding analog signals that are further filtered to reduce noise signal components. A quadrature modulator then transforms the filtered signals and a local oscillator signal to a transmitted output signal, which may be transmitted to a wireless receiver.

With another aspect of the disclosure, some of the circuit components may comprise discrete devices that result in a reduction of power consumption for the quadrature modulator system.

With another aspect of the disclosure, some or all of the circuit components may be incorporated into a same electronic device. For example, an in-phase/quadrature-phase (I/Q) converter and oversampling noise-shaping modulator may be implemented within one field-programmable gate array.

BRIEF DESCRIPTION OF THE DRAWINGS

A more complete understanding of the exemplary embodiments the present invention and the advantages thereof may be acquired by referring to the following description in consideration of the accompanying drawings, in which like reference numbers indicate like features and wherein.

DETAILED DESCRIPTION

In the following description of the various exemplary embodiments, reference is made to the accompanying drawings which form a part hereof, and in which is shown by way of illustration various embodiments in which the invention may be practiced. It is to be understood that other embodiments may be utilized and structural and functional modifications may be made without departing from the scope of the present invention.

Figure 1:
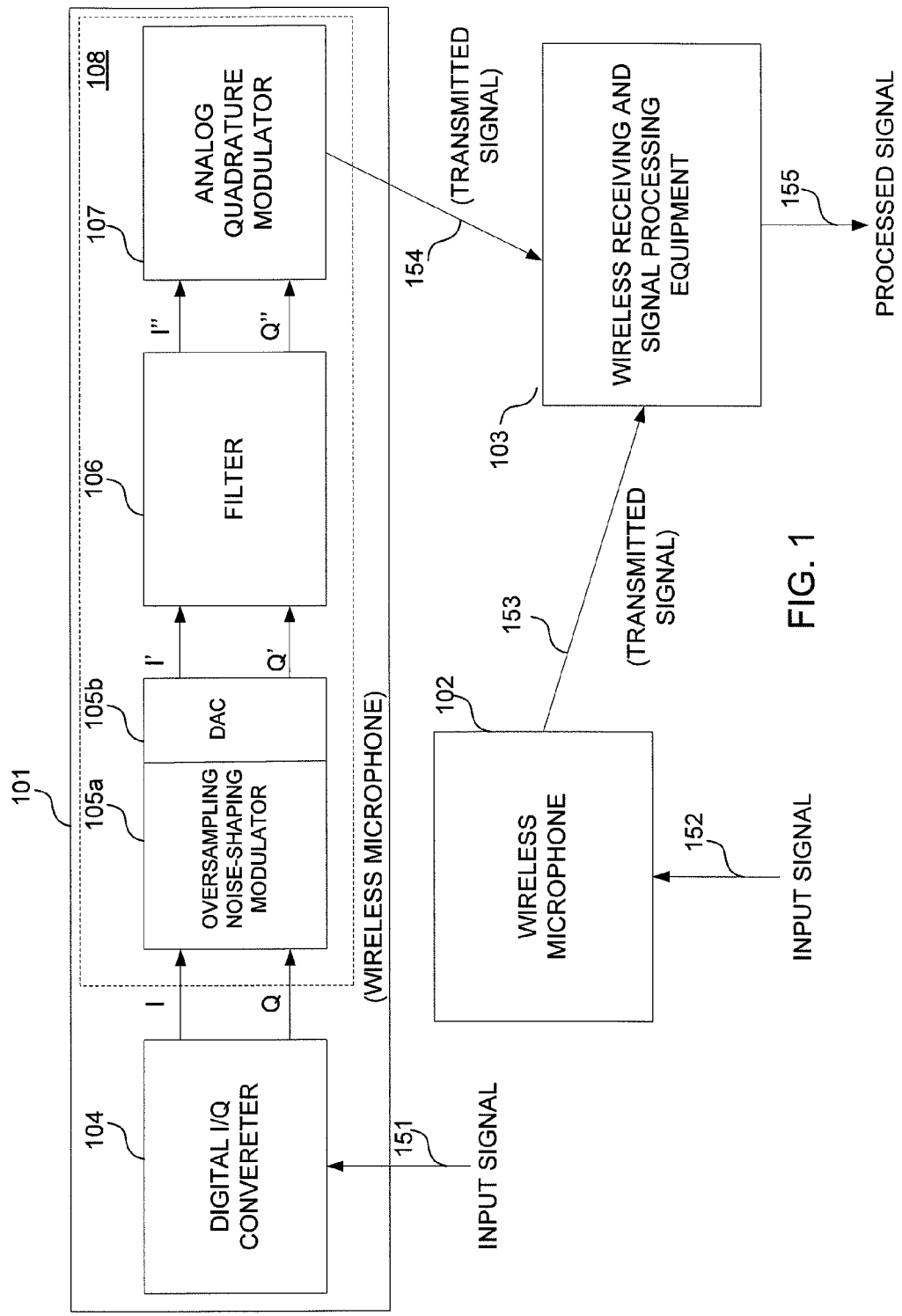
FIG. 1 shows a communications system with wireless microphones in accordance with aspects of the disclosure.

FIG. 1 shows a communications system with wireless microphones 101 and 102 communicating with wireless receiving and signal processing equipment 103 over wireless channels 153 and 154, respectively, in accordance with aspects of the disclosure. With some embodiments, more than one wireless microphone (e.g., with forty or more wireless microphones for some musical theater productions) may be used to support different members (corresponding to input signals 151 and 152) of a performance group. In such cases, wireless equipment 103 may be housed in a half-rack configuration, so that two can be mounted together in a rack system. While FIG. 1 shows only one communications channel between each wireless microphone 101, 102 and wireless receiving and signal processing equipment 103, some embodiments may also support diversity receivers which receive multiple channels of transmission from each microphone to provide additional robustness.

Embodiments may support wireless audio equipment that attaches to a user (e.g., a body pack) and that processes an input signal obtained from a separate microphone.

A spectrally efficient complex modulation may be used when spectral efficiency (bps/Hz) is an important consideration due to operation in the UHF band (often referred as TV whitespace) where limited bandwidth exists. Because complex modulation refers to simultaneous amplitude and phase modulation of a transmitted carrier signal over communications channels 153 and 154, complex modulation typically complicates the modulator as compared to analog modulation, e.g., frequency modulation. Traditional FM systems are often highly optimized in terms of battery life (i.e., power consumption) and monetary cost which has set a certain expectation in the industry. As will be further discussed, some embodiments address cost considerations (e.g., power, monetary, and size) for the support of digital carrier modulation.

Wireless microphone 101 includes digital I/Q converter 104, oversampling noise-shaping modulator 105a, low resolution digital-analog converter (DAC) 105b, filter 106, and analog quadrature modulator 107. While oversampling noise-shaping modulator 105a and DAC 105b are shown as two elements in FIG. 1, oversampling noise-shaping modulator 105a may share some commonality with DAC 105b and may be partially implemented in a single electronic device, e.g., digital signal processor (DSP), microprocessor, application specific integrated circuit (ASIC), or field-programmable gate array (FPGA).

Digital I/Q converter 104 converts input signal 151 (corresponding to an analog waveform) into a digitally modulated waveform that includes an in-phase (I) signal component and a quadrature-phase (Q) signal component (which has a 90 degree phase displacement with respect to the I signal component) in order to provide a two dimensional representation of the digitally modulated waveform.

The digitally modulated waveform is then processed by quadrature modulation system 108, which includes oversampling noise-shaping modulator 105a, low resolution digital-analog converter (DAC) 105b, filter 106, and analog quadrature modulator 107. With some embodiments, quadrature modulation system 108 optimizes power consumption as will be further discussed. Quadrature modulation system 108 processes the digitally modulated waveform (comprising the I and Q signal components) and forms an analog modulated carrier, which may be represented as:

$$s(t)=Re(e^{j\omega t} \times (I(t)+jQ(t))) \quad \text{(EQ. 1)}$$

Wireless receiving and signal processing equipment 103 processes signals received over channels 153 and 154 and forms processed signal 155 that may be recorded on a recording medium or may be played through an acoustic system (e.g., a speaker system).

Figure 2:
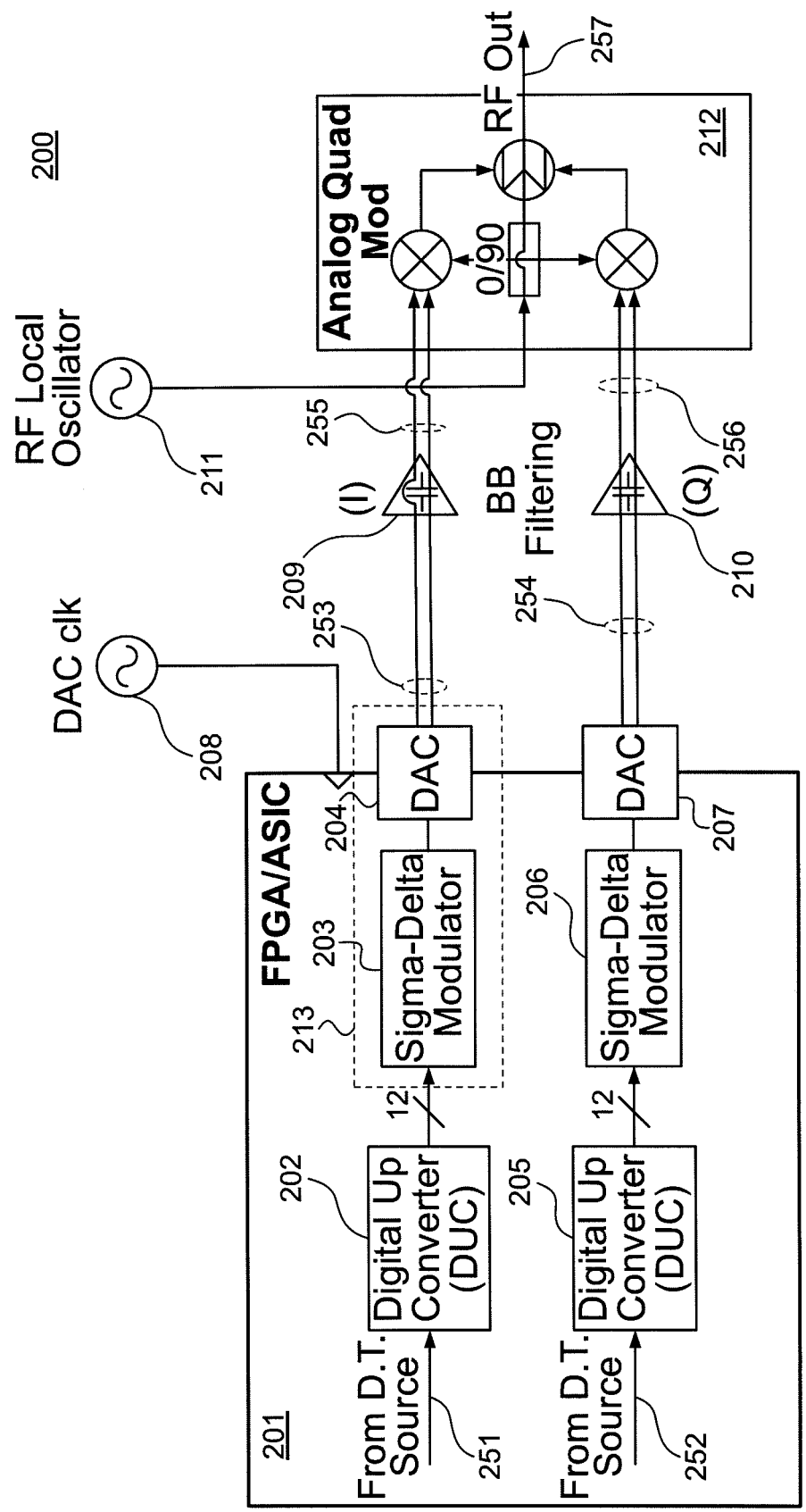
FIG. 2 shows a quadrature modulator system in accordance with aspects of the disclosure.

FIG. 2 shows a quadrature modulator system 200 in accordance with aspects of the disclosure. Quadrature modulator system 200 is a collection of subsystems to create an optimized quadrature modulator, where important metrics are power cost, monetary cost, and size cost when compared to traditional systems. With some embodiments, some of the components may be implemented in electronic device 201, e.g., field programmable gate array (FPGA) or application specific integrated circuits (ASIC).

With traditional systems, an external high speed current-steering digital-to-analog converter integrated circuit is often used. However, with some embodiments, quadrature modulator system 200 uses sigma-delta modulator 203 and low resolution DAC 204 for the I component and sigma-delta modulator 206 and low resolution DAC 207 for the Q component. As will be further discussed, sigma-delta modulators 203 and 206 and low resolution DACs 204 and 207 may be implemented within the same field-programmable logic array (FPGA) or application specific integrated circuits (ASIC) that is often used to implement discrete time processing of an input signal in wireless audio equipment.

Sigma-delta modulator 203 supports sigma-delta ($\Sigma\Delta$) (sometimes referred as delta-sigma ($\Delta\Sigma$)) modulation for encoding high resolution signals into lower resolution signals by using pulse-density modulation.

Using sigma-delta modulation, quadrature modulation system 200 typically has less power consumption and lower cost compared to traditional digital-analog converters. For example, as compared to a traditional system using a high speed current steering DAC integrated circuit, quadrature modulation system 200 consumes approximately 70% less power, costs approximately 50% less, and has a size cost that is approximately 30% less. Additionally, some or all of quadrature modulation system 200 may be included into existing digital logic (e.g., ASIC or FPGA) that already exists in the wireless system 101, further reducing their cost and power.

In addition to the replacement of external DACs that are often used in traditional systems, quadrature modulation system 200 also reduces digital routing (corresponding to reducing I/O requirements) with the incorporation of the DACs into the same electronic chip as preceding digital processing.

Embodiments may incorporate different on-off chip combinations. For example, all functionalities of quadrature modulation system 200 may be on one chip (electronic device). Alternatively, some embodiments may incorporate only the digital I/Q generator, oversampling noise-shaping modulator, and digital-analog converter on one chip. With other embodiments, the digital I/Q generator, oversampling noise-shaping modulator, digital-analog converter, and analog quadrature modulator may be on one chip while the baseband filters may be external to the chip. With other embodiments, the digital I/Q generator, oversampling noise-shaping modulator, and digital-analog converter may be on one chip while the baseband filters and the analog quadrature modulator are located on a second chip.

Quadrature modulation system 200, whose sampling is driven by clock 208, includes three circuit components (subsystems), including digital-analog transformation circuit 213, baseband filter 209, and analog quadrature modulator 212. Digital-analog transformation circuit 213, which converts discrete time samples to a continuous time signal, further includes oversampling noise-shaping modulator (e.g., sigma-delta modulator) 203 and DAC 204. Baseband (BB) filter 209 then removes out-of-band energy including sampling images, quantization noise, and so forth. With some embodiments, filter 209 comprises an active filter. The filter order, filter shape, and filter cutoff frequency is typically dependent on the specifics of the sigma-delta modulator. For example, a specific sigma-delta modulator may be modeled and a spectral density plot may be created. From the spectral density plot, a magnitude frequency response may be specified such that the out-of-band noise level is reduced to a desired level. From this magnitude frequency response, a filter with an appropriate order, shape (e.g., Butterworth, Chebyshev, etc.), and cutoff frequency may be selected. While circuit components 202-204 and 209 are associated with I signal processing, similar circuit components 205-207 and 210 are associated with Q signal processing.

Analog quadrature modulator 212 then multiplies the generated, analog forms of in-phase (I) and quadrature-phase (Q) waveforms with an analog complex sinusoid of the desired carrier frequency based on RF oscillator 211 in accordance with EQ. 1.

Quadrature modulation system 200 enables a carrier to be modulated in both amplitude and phase (or equivalently in-phase and quadrature-phase) simultaneously to support any two-dimensional modulation digital scheme to be realized, including digital quadrature amplitude modulation (QAM), phase shift keying (PSK), orthogonal frequency division multiplexing (OFDM), and continuous phase modulation (CPM). Quadrature modulation system 200 may be incorporated in different wired and wireless communication systems, including wireless microphone systems.

Digital up converters (DUCs) 202 and 205 add additional samples to digital I and Q signals 251 and 252, respectively. For example, each sample may be repeated so that the sample rate is increased With oversampling noise-shaping modulator 203, resolution in time is traded for resolution in amplitude (i.e., quantization level) by oversampling the input signal. With some embodiments, oversampling noise-shaping modulator 203 may comprise a sigma-delta modulator (which may also be referred as a delta-sigma modulator).

Baseband filters 209 and 210 provide filtering of analog I and Q signals, respectively, to reject sampling images and out-of-band quantization noise. Baseband filters 209 and 210 may assume an active filter configuration in order to create low bandwidth filters where inductor sizes become prohibitively large.

Figure 8:
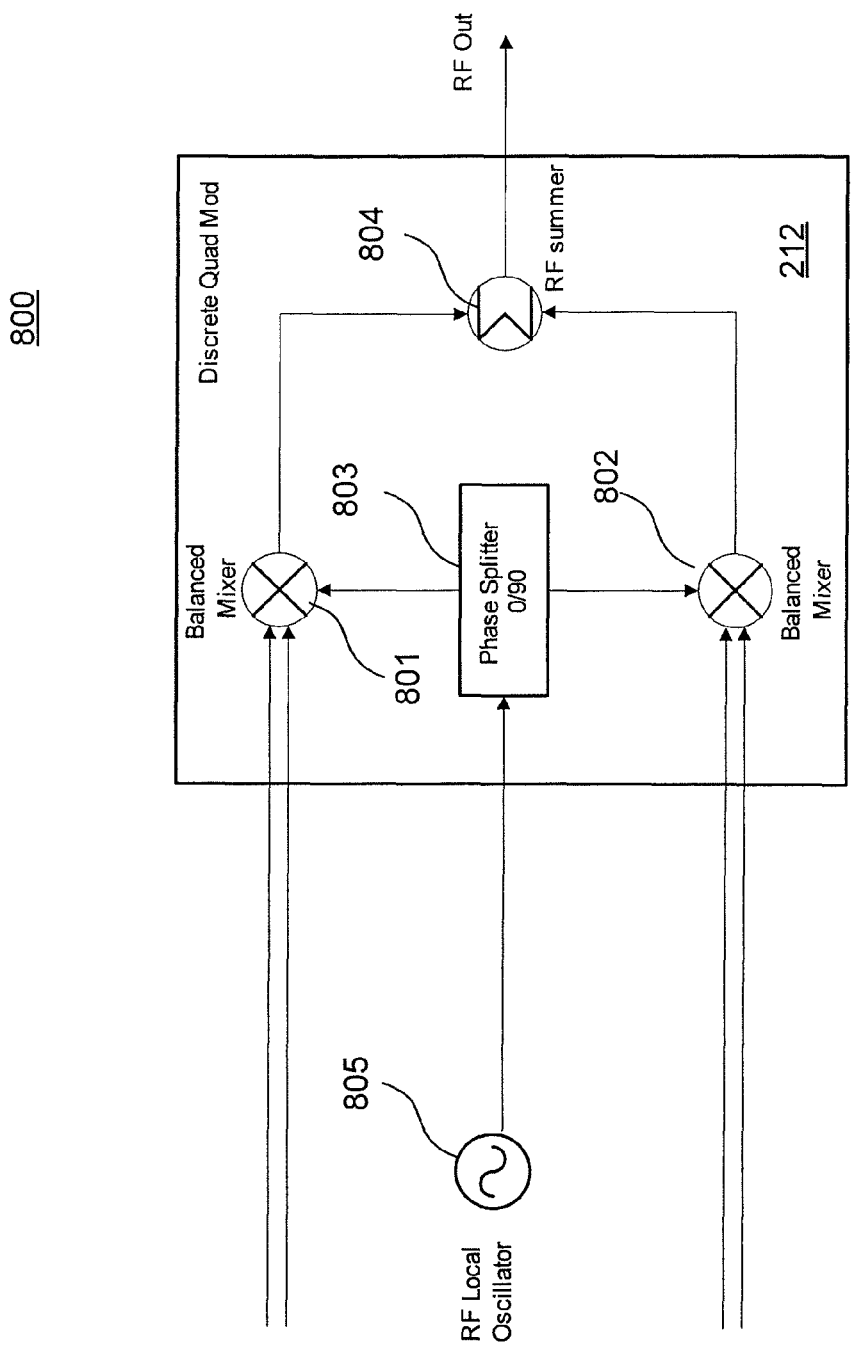
FIG. 8 shows a block diagram of a discrete quadrature modulator in accordance with aspects of the disclosure.

Discrete implementation of analog quadrature modulator 212 helps to minimize power consumption. This allows optimization of each element of the analog quadrature modulator 212. The main elements include balanced mixers 801 and 802, phase splitter 803, and analog summer 804 as shown in FIG. 8. Analog quadrature modulator 212 forms RF output signal 257 (corresponding to transmitted signals that are carried over communications channels 153 and 154 as shown in FIG. 1).

With some embodiments, some of the subsystems may be interconnected using differential signals over connections 253-256, in which transmitted output signals comprise corresponding non-inverted and inverted signals to reduce signal contamination.

Figure 3:
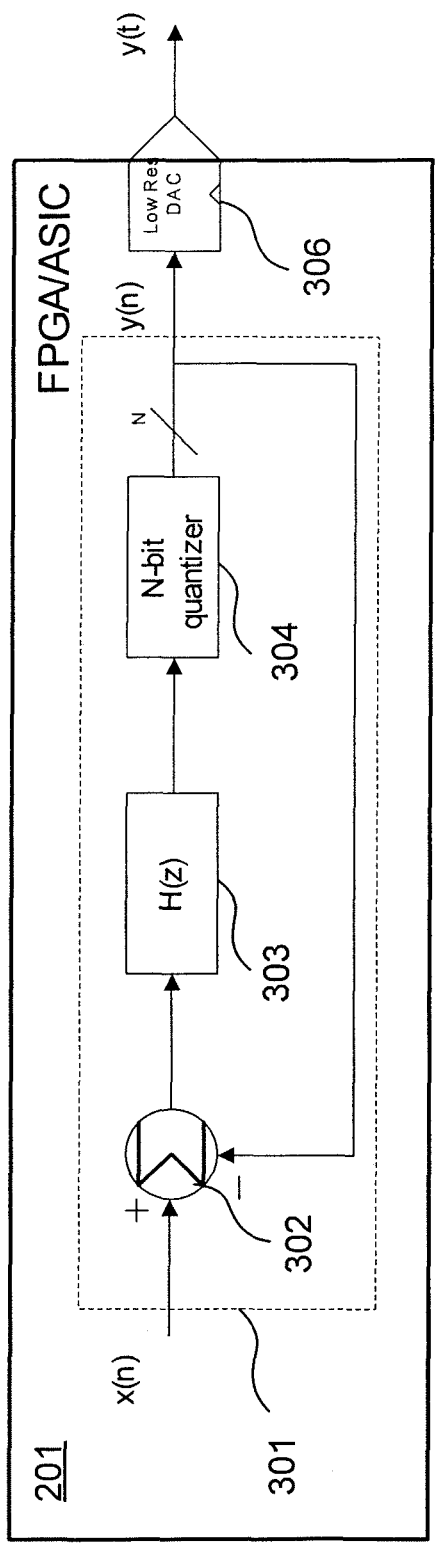
FIG. 3 shows a block diagram of a sigma-delta modulator used as an oversampling noise-shaping modulator in accordance with aspects of the disclosure.

FIG. 3 shows block diagram of a sigma-delta modulator 301 (corresponding to sigma-delta modulator 203 as shown in FIG. 2) used as a oversampling noise-shaping modulator in accordance with aspects of the disclosure. As previously discussed, sigma-delta modulator 301 may be located in the same electronic circuit (e.g., FPGA 201) as preceding processing logic (e.g., digital I/Q converter 104). In addition, some or all of low resolution DAC 306 may be incorporated in the same electronic device.

H(z), which is the transfer function of modulator filter 303, and the number of quantizer bits associated with quantizer 304, are the primary tunable parameters of sigma-delta modulator 301.

The transfer function H(z) of modulator filter 303 may be determined from the noise transfer function (NTF) and the signal transfer function (STF) by:

$$NTF=Y(z)/N(z)=1/(1+H(z)) \qquad (EQ.\ 2)$$

$$STF=Y(z)/X(z)=H(z)/(1+H(z)) \qquad (EQ.\ 3)$$

For example, a second order filter transfer function H(z) when $NTF=(1-z^{-1})^2=1-2z^{-1}+z^{-2}$ by:

$$H(z)=(1-NTF)/NTF=(2z^{-1}-z^{-2})/(1-2z^{-1}+z^{-2}) \qquad (EQ.\ 4)$$

The above NTF results in a $2^{nd}$ order H(z) that is a good compromise between performance and complexity. Lower orders may more correlated quantization noise (i.e., tonal) where higher order modulators may have stability problems.

Sigma-delta modulator 301 includes signal combiner (which may be referred as a summer) 302, modulator filter 303, and quantizer 304. As shown in FIG. 3, signal combiner 302 subtracts the quantized output from quantizer 304 from the digital I signal from digital up converter 202 (as shown in FIG. 2). While the digital I signal is depicted having M bits (e.g., 12 bits as shown in FIG. 2) and the quantized I signal from quantizer 304 as having N quantized bits, signal-delta modulator 301 adjusts the number of bits from quantizer 304 to match the number of bits associated with the digital I signal so that signal combiner 302 can subtract the two numbers. For example, when the number of quantized bits equals N, the number of quantized states equals $2^N$, where the number of bits of the digital I signal may be reduced to match the number of bits from quantizer 304.

Figure 5:
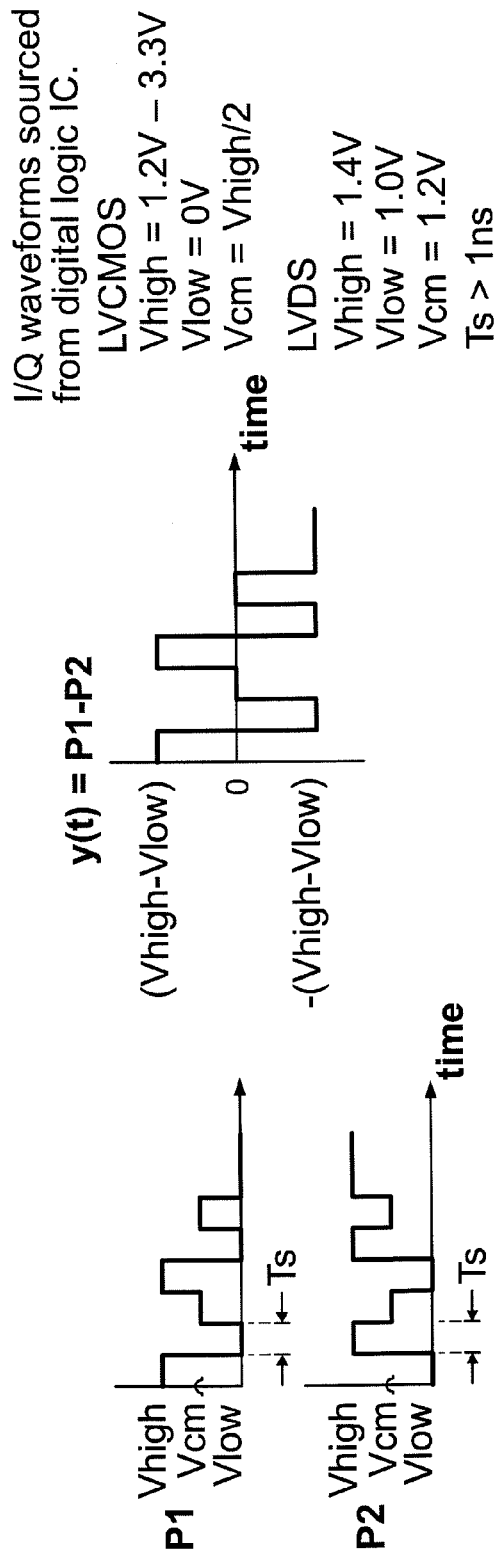
FIG. 5 shows a block diagram for a low resolution digital-to-analog converter (DAC) in accordance with aspects of the disclosure.
Figure 5:
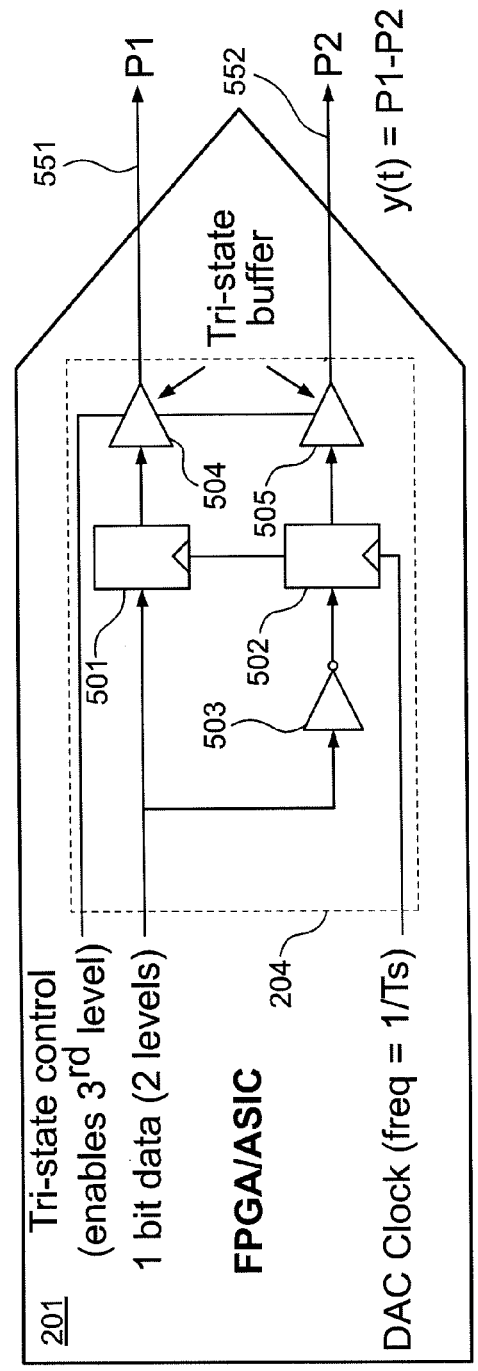

Sigma-delta modulator 301 executes in discrete time and thus may be implemented in digital logic. When the number of quantizer bits is chosen to be one (i.e., N=1), the design of low resolution DAC 306 which interfaces at the output of sigma-delta modulator 301 is simplified (since it has only 2 quantized states), and standard digital logic I/O may be used to implement the low resolution DAC as shown in FIG. 5. Even when the number of quantizer states from sigma-delta modulator 301 is greater than two, several digital I/O circuits may be combined to create more than three states. With the incorporation of sigma-delta modulator 301 and DAC 306 within the same electronic device, the associated cost may be significantly reduced.

Figure 4:
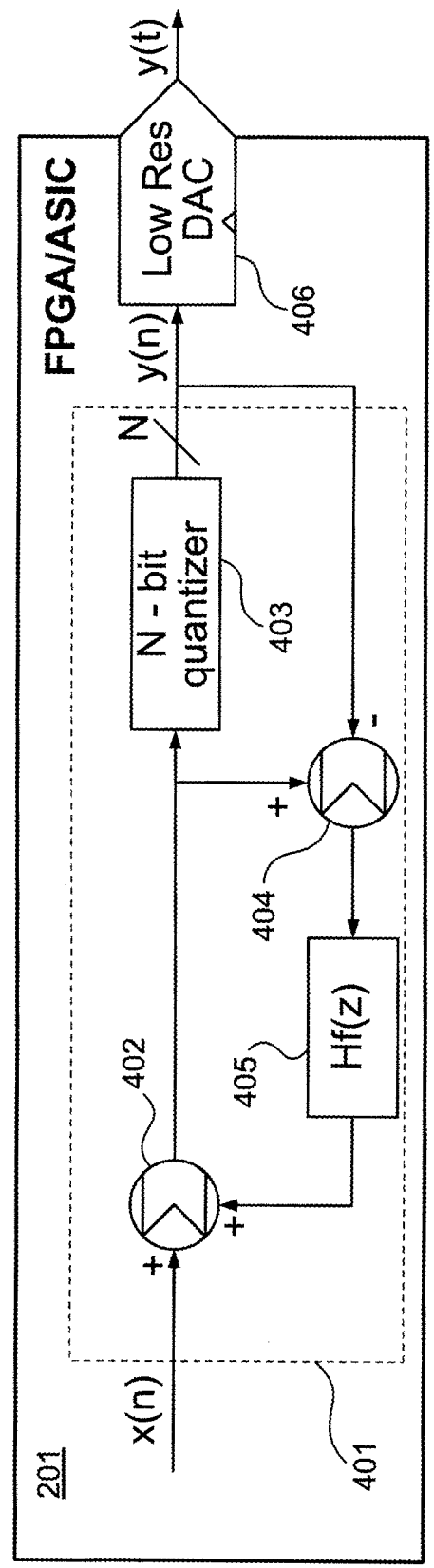
FIG. 4 shows a block diagram of a sigma-delta modulator used as an oversampling noise-shaping modulator in accordance with aspects of the disclosure.

FIG. 4 shows a block diagram sigma-delta modulator 401 used as an oversampling noise-shaping modulator in accordance with aspects of the disclosure, where block diagram 401 is an alternative embodiment of sigma-delta modulator 203 as shown in FIG. 2.

Hf(z), which is the transfer function of modulator filter 405, and the number of quantizer bits associated with quantizer 403, are the primary tunable parameters of sigma-delta modulator 401.

The transfer function Hf(z) of modulator filter 405 may be determined from the noise transfer function (NTF) and the signal transfer function (STF) by:

$$NTF=Y(z)/N(z)=1-Hf(z) \qquad (EQ.\ 5)$$

For example, a second order filter transfer function Hf(z) when NTF=$(1-z^{-1})^2=1-2z^{-1}+z^{-2}$ by:

$$Hf(z)=(1-NTF)=(2z^{-1}-z^{-2}) \qquad (EQ.\ 6)$$

Sigma-delta modulator 401 includes first signal combiner (summer) 402, N-bit quantizer 403, second combiner (summer) 404, and modulator filter 405. First signal combiner 402 adds a filtered signal from modulator filter 405 and the digital I signal from digital up converter 202 (as shown in FIG. 2). Second signal combiner 404 then subtracts the quantized output from the output of first signal combiner 402.

In concert with the previous discussion, signal-delta modulator 401 adjusts the number of bits from quantizer 403 to match the number of bits associated with the digital I signal from digital up converter 202 (as shown in FIG. 2).

While some embodiments may incorporate a second order sigma-delta modulator, other embodiments may incorporate an N order sigma-delta modulator, where the order is greater than or less than two. A higher order modulator may increase the in-band signal to noise ratio (SNR).

While sigma-delta modulators 301 and 401 (as shown in FIGS. 3 and 4, respectively) may comprise a single stage, other embodiments may utilize a multi-stage noise shaping (MASH) configuration, where first order sigma-delta modulators are cascaded to form higher order noise shaping. While a higher order single stage sigma-delta modulator may incur instability characteristics, stability is assured with a multi-stage first order sigma-delta modulator configuration because each first order loop is stable.

FIG. 5 shows a block diagram for a low resolution digital-to-analog converter (DAC) 204 in accordance with aspects of the disclosure. DAC 204 provides a differential output from non-inverted output 551 and inverted output 552. Non-inverted output 551 and inverted output 552 are obtained from registers 501 and 502, respectively, where the registers are clocked by DAC clock 208 (as shown in FIG. 2), and the input to register 502 is inverted by inverter 503.

While DAC 204 can support two quantizer states (i.e., output 551 equal '1'/output 552 equal '0' and output 551 equal '0'/output 552 equal '1') corresponding to one quantizer bit, DAC 204 may further support a third state by activating a high impedance state of buffers 504 and 505. With tristate buffers, the third state is a Hi-Z (high impedance) state. When each of the output buffers is at high-Z, and the external circuit doesn't create a bias, the differential output (y(t)=P1-P2) will be '0'. So the collection of differential states is +1, −1, and 0. This approach allows one more level (3 states compared to 2 states) for the quantizer, which may benefit the operation of the sigma-delta modulator.

If the input node to the active filter (when filter 209 or filter 210 comprises an active filter) is a summing node, then multiple different input signals may be summed together before the active filter. When implementing a binary weighed DAC or so called "R-2R" DAC, multiple signals may be connected through resistors to a summing node (which may be inherent in the active filter).

Figure 6:
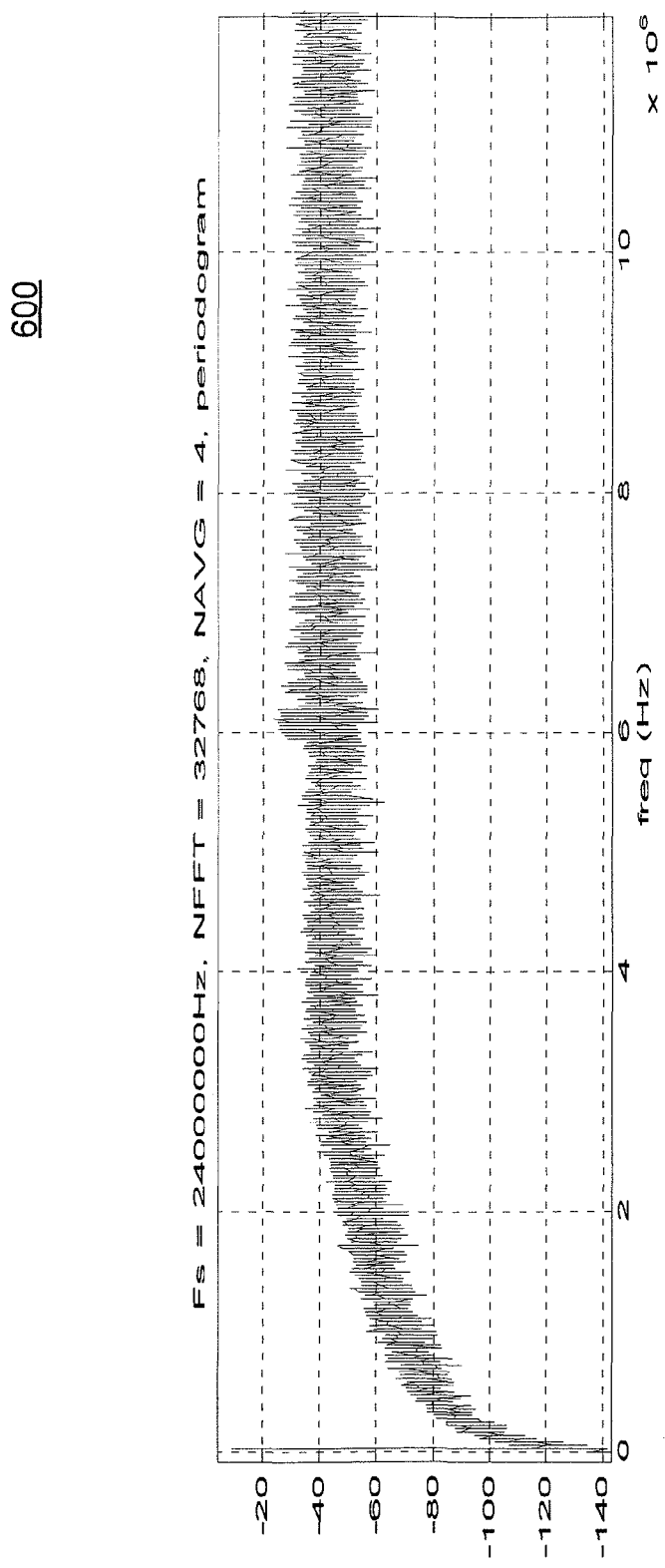
FIG. 6 shows a low pass second order spectral density of a sigma-delta DAC in accordance with aspects of the disclosure.

FIG. 6 shows low pass second order spectral density response 600 of sigma-delta modulator 203 in accordance with aspects of the disclosure. However, the corresponding response for digital-analog transformation circuit 213 (i.e., sigma-delta modulator 203 in tandem with DAC 204 as shown in FIG. 2) may be similar with the incorporation of zero-order hold interpolation, in which digital-analog transformation circuit 213 shapes the out-of-band quantization noise. FIG. 6 shows a power spectral density plot of a low pass $2^{nd}$ order single bit sigma-delta modulator with a full scale tone and an over sampling ratio=960.

Baseband filters 209 and 210 (as shown in FIG. 2) remove the increased out-of-band noise and thus requiring more aggressive filtering requirements than if a typical Nyquist DAC were used (e.g., the high speed current steering DAC used in traditional systems)

Baseband filtering requirements of filters 209 and 210 are typically dependent on the target application and other system parameters. For example, increasing the over-sampling ratio (OSR) of sigma-delta modulator 203 and DAC 204 by a factor of two may move the baseband filter corner out by a factor of two. Extremely efficient resistor-capacitor (RC), inductor-capacitor (LC), and active filters may be designed depending on the requirements. When corner frequencies approach 1 MHz and below, active filtering typically becomes favorable due to the large inductor sizes in LC filters.

Figure 7:
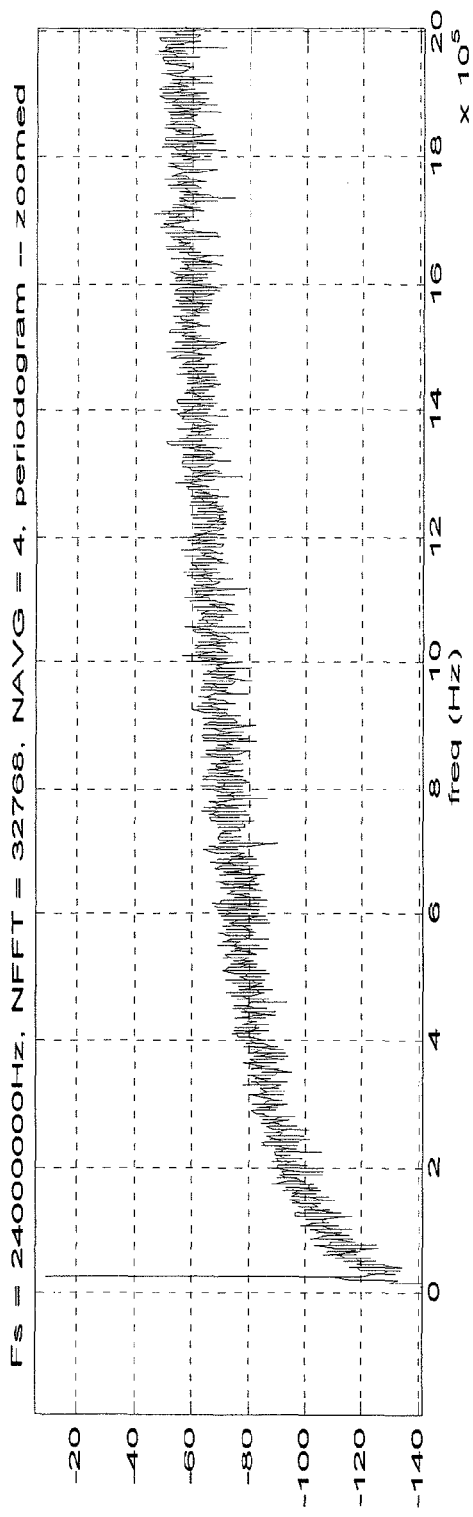
FIG. 7 shows a zoomed version of the spectral density shown in FIG. 6 in accordance with aspects of the disclosure.

FIG. 7 shows a zoomed version 700 of the spectral density shown in FIG. 6 in accordance with aspects of the disclosure. While FIG. 6 shows the spectral density over 12 MHz, zoomed version 700 spans 2 MHz. A typical bandwidth for a wireless microphone channel is approximately 200 KHz, where the I and Q components have meaningful information between 0 and 100 KHz. Consequently, the high fidelity region is between 0 and 100 KHz, which is at the left side of plot 700. The rest of the signal energy (i.e., at frequencies greater than 100 KHz) may be filtered out by filters 209 and 210.

FIG. 8 shows block diagram 800 of a discrete quadrature modulator (e.g., analog quadrature modulator 212 as shown in FIG. 2) in accordance with aspects of the disclosure.

With traditional systems, analog quadrature modulators are typically found as integrated circuits from several manufacturers. Most of the available modulators target cellular infrastructure markets where high performance (and therefore high power) is needed. Additionally, the frequency bands for cellular communications are not typically in the UHF (470 MHz-900 MHz) bands. For example, a traditional quadrature modulator has a power consumption if approximately 126 mW while the discrete quadrature modulator has a power consumption of approximately 36 mW. This translates to a measurable savings in battery life (nearly 2 hours for some wireless microphone systems).

The main components of discrete quadrature modulator 800 are extremely power efficient double balanced mixers 801 and 802 and 90-degree phase splitter 803. However, other mixers (e.g., active mixers, passive mixers, single balanced, etc.) may be incorporated in some embodiments. If it is desirable to attenuate the local oscillator (LO) component 805 at the RF port of the mixer, a balanced mixer should be considered. The LO rejection of quadrature modulator 800 is related to how well each of the mixers 801 and 802 themselves reject the LO signal. Consequently, the quadrature combining does not cancel the LO component signals. Because quadrature modulator 800 has a discrete configuration, the bias point of each mixer 801 and 802 (LO drive level for passive mixers) may be tuned to the specific application, and therefore a relation between mixer performance and power consumption exists.

Discrete summer 804 combines the mixer outputs from mixers 801 and 802 to form an RF output signal corresponding to RF output 257 as shown in FIG. 2.

With some embodiments, phase splitter 803 is a passive phase splitter, often reducing cost. There are different ways to construct a passive phase splitters, each having associated characteristics. One important parameter of phase splitter 803 is phase balance, which defines the operating bandwidth of the phase splitter. The amplitude balance is also important but typically to a lesser degree as the mixer gains are desensitized to varying LO drive levels.

While some embodiments support at least some of the components in a discrete form, a plurality of the components may be contained in a same electronic device for other embodiments.

Figure 9:
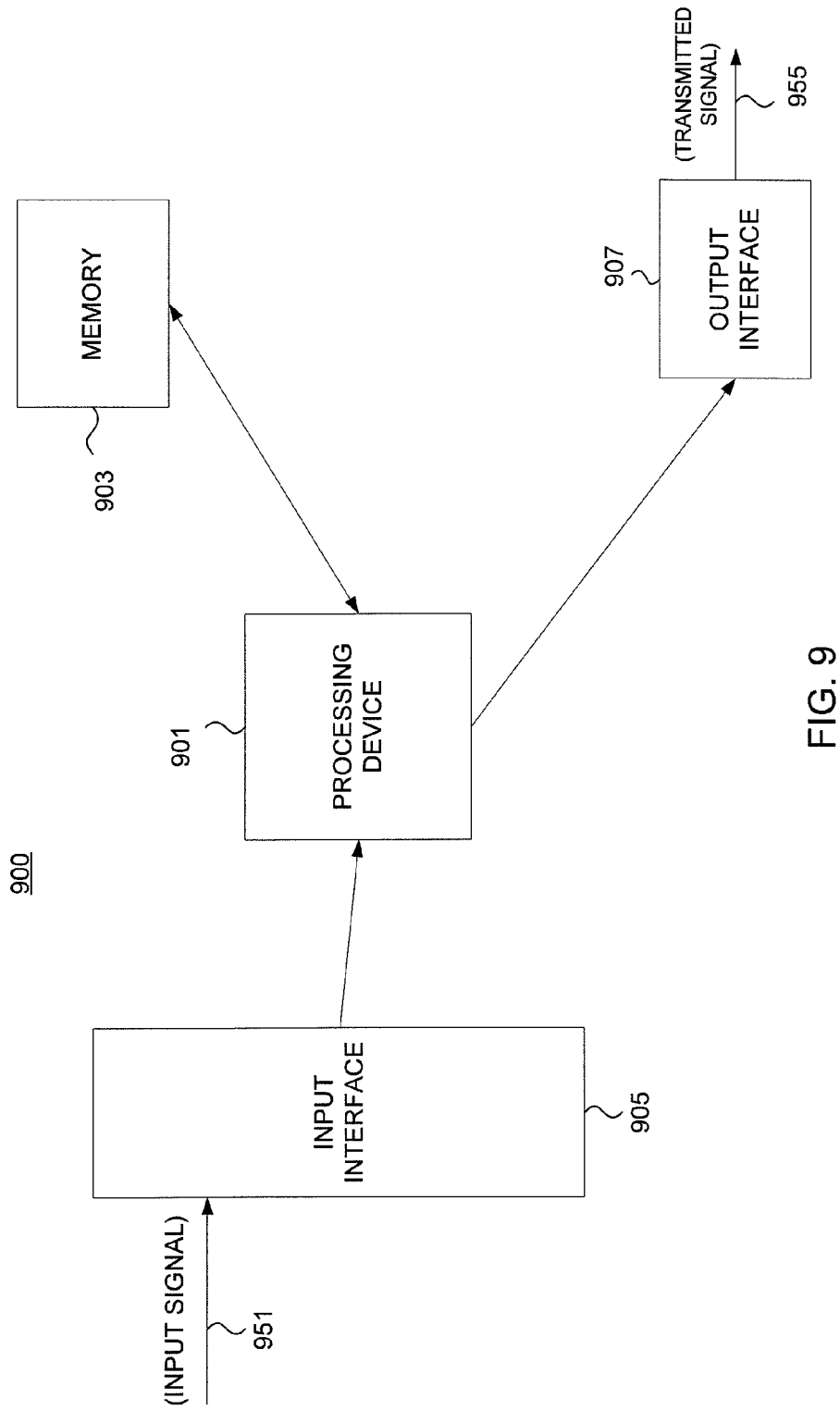
FIG. 9 shows an apparatus that processes an input signal and transmits the processed signal over a wireless channel to wireless receiving and signal processing equipment in accordance with aspects of the disclosure.

FIG. 9 shows apparatus 900 processes and input signal and transmits the processed signal over a wireless channel to wireless receiving and signal processing equipment in accordance with aspects of the disclosure. Processing device 901 may execute computer executable instructions from a computer-readable medium, for example, memory 903 in order perform a data transmission process (any or all of the transmission processes described herein). Computer storage media may include volatile and nonvolatile, removable and non-removable media implemented in any method or technology for storage of information such as computer readable instructions, data structures, program modules or other data. Computer storage media include, but may not be limited to, random access memory (RAM), read only memory (ROM), electronically erasable programmable read only memory (EEPROM), flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed by processing device 901. The executable instructions may carry out any or all of the method steps described herein.

With some embodiments, processing device 901 may comprise one or more processors. For example, processing device 901 may include a digital signal processor (DSP) or other microprocessors utilizing one or more cores to implement one concealment technique while another microprocessor may perform another concealment technique.

With some embodiments, apparatus 900 may be implemented as one or more processing devices providing non-sequential and/or parallel processing such as programmable logic devices (PLDs), field-programmable logic arrays (FPGAs), application specific integrated circuits (ASICs), or other integrated circuits having instructions or logical processing for performing operations as described in connection with one or more of any of the embodiments described herein. Said instructions may be software and/or firmware instructions stored in a machine-readable medium and/or may be hard-coded as a series of logic gates and/or state machine circuits in one or more integrated circuits and/or in one or more integrated circuits in combination with other circuit elements.

While the invention has been described with respect to specific examples including present modes of carrying out the invention, those skilled in the art will appreciate that there may be numerous variations and permutations of the above described systems and techniques that fall within the spirit and scope of the exemplary embodiments of the invention as set forth in the appended claims.

What is claimed is:

1. An apparatus comprising;
    an in-phase/quadrature-phase (I/Q) converter receiving an input signal and converting the input signal to the digital in-phase (I) signal and the digital quadrature (Q) signal, wherein the input signal is received within a wireless audio equipment;
    at least one oversampling noise-shaping modulator converting (i) a digital in-phase (I) signal and a digital quadrature (Q) signal to a quantized I signal and (ii) the digital Q signal to a quantized Q signal, wherein the quantized I signal and the quantized Q signal are quantized with a desired number of quantized bits per sample, wherein the at least one oversampling noise-shaping modulator comprises a sigma-delta modulator and wherein the sigma-delta modulator comprises:
        a modulator filter characterized by a transfer function;
        a first signal combiner summing the digital I signal and a filtered signal from the modulator filter to form a first summed signal;
        an N-bit quantizer quantizing the first summed signal to form the quantized I signal in accordance with N quantized bits;
        a second signal combiner subtracting the quantized I signal from the first summed signal to form a second summed signal; and
        a modulator filter filtering the second summed signal in accordance with the transfer function to reduce a noise level of the second summed signal to obtain the filtered signal;
    at least one digital-analog converter (DAC) converting the quantized I signal and the quantized Q signal to an analog I signal and an analog Q signal, respectively;
    at least one filter reducing noise components of the analog I and Q signals by a predetermined level to form filtered I and Q signals; and
    an analog quadrature modulator transforming the filtered I and Q signals and a local oscillator signal to a transmitted output signal, wherein the transmitted output signal is transmitted to a wireless receiver.

2. The apparatus of claim 1, wherein the wireless audio equipment comprises a wireless microphone.

3. The apparatus of claim 1, wherein the at least one oversampling noise shaping modulator and the I/Q converter are included in a same electronic device.

4. The apparatus of claim 1, wherein the at least one DAC, the at least one filter, and the analog quadrature modulator are included in a same electronic device.

5. The apparatus of claim 3, wherein the same electronic device comprises a field-programmable gate array (FPGA).

6. The apparatus of claim 1, wherein the analog quadrature modulator comprises:
    a discrete phase splitter forming an in-phase local oscillator signal and a quadrature-phase local oscillator signal from the local oscillator signal;
    a first discrete mixer mixing the filtered I signal with the in-phase local oscillator signal to form a first mixed signal;
    a second discrete mixer mixing the filtered Q signal with the quadrature-phase local oscillator signal to form a second mixed signal; and
    a discrete summer summing the first mixed signal and the second mixed signal to form the transmitted output signal.

7. The apparatus of claim 1, the analog I signal comprising a differential output, the differential output having one of three differential voltage states, said one of the differential states corresponding to a high impedance state.

8. A non-transitory computer-readable storage medium storing computer-executable instructions that, when executed, cause a processor to perform:
    receiving an input signal within a wireless microphone system and converting the input signal to the digital in-phase (I) signal and the digital quadrature-phase (Q) signal;
    oversampling a digital in-phase (I) signal and a digital quadrature (Q) signal to obtain increased amplitude resolution and converting the digital I signal and the digital Q signal to a quantized I signal and the digital Q signal to a quantized Q signal, wherein the quantized I signal and the quantized Q signal are quantized to a desired number of quantized bits per sample, wherein the oversampling comprises;
  summing the digital I signal and a filtered signal to form a first summed signal;
  quantizing the first summed signal to form the quantized I signal in accordance with N quantized bits;
  subtracting the quantized I signal from the first summed signal to form a second summed signal; and
  filtering the second summed signal to reduce a noise level of the second summed signal to obtain the filtered signal;
converting the quantized I signal and the quantized Q signal to an analog I signal and an analog Q signal, respectively;
reducing noise components of the analog I and Q signals by a predetermined level to form filtered I and Q signals; and
transforming the filtered I and Q signals and a local oscillator signal to a transmitted output signal, wherein the transmitted output signal is transmitted to a wireless receiver.

9. A method comprising:
receiving an input signal within a wireless microphone system and converting the input signal to the digital in-phase (I) signal and the digital quadrature-phase (Q) signal;
oversampling a digital in-phase (I) signal and a digital quadrature (Q) signal to obtain increased amplitude resolution and converting the digital I signal and the digital Q signal to a quantized I signal and the digital Q signal to a quantized Q signal, wherein the quantized I signal and the quantized Q signal are quantized to a desired number of quantized bits per sample, the oversampling comprising:
  summing the digital I signal and a filtered signal to form a first summed signal;
  quantizing the first summed signal to form the quantized I signal in accordance with N quantized bits;
  subtracting the quantized I signal from the first summed signal to form a second summed signal; and
  filtering the second summed signal to reduce a noise level of the second summed signal to obtain the filtered signal;
converting the quantized I signal and the quantized Q signal to an analog I signal and an analog Q signal, respectively;
reducing noise components of the analog I and Q signals by a predetermined level to form filtered I and Q signals; and
transforming the filtered I and Q signals and a local oscillator signal to a transmitted output signal, wherein the transmitted output signal is transmitted to a wireless receiver.

* * * * *